(12) United States Patent
Kim et al.

(10) Patent No.: US 7,528,071 B2
(45) Date of Patent: May 5, 2009

(54) METHOD FOR FABRICATING SEMICONDUCTOR DEVICE

(75) Inventors: Jong Guk Kim, Gyeonggi-do (KR); Kyu Cheol Shim, Gyeonggi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 132 days.

(21) Appl. No.: 11/613,069

(22) Filed: Dec. 19, 2006

(65) Prior Publication Data
US 2007/0155177 A1 Jul. 5, 2007

(30) Foreign Application Priority Data
Dec. 29, 2005 (KR) .................. 10-2005-0134448

(51) Int. Cl.
*H01L 21/44* (2006.01)

(52) U.S. Cl. ............... 438/687; 438/677; 438/679; 257/762; 257/E23.011; 257/E21.17

(58) Field of Classification Search .......... 438/677, 438/678, 658, 660, 798, 638, 687; 257/E23.011, 257/E21.3, E21.17, E21.479, E21.478, 762
See application file for complete search history.

(56) References Cited

U.S. PATENT DOCUMENTS

| | | | |
|---|---|---|---|
| 2004/0084318 A1* | 5/2004 | Cohen | 205/98 |
| 2006/0094237 A1* | 5/2006 | Lin et al. | 438/653 |
| 2007/0249156 A1* | 10/2007 | Bonilla et al. | 438/622 |
| 2008/0105978 A1* | 5/2008 | Schmitt et al. | 257/751 |

* cited by examiner

*Primary Examiner*—Caridad M Everhart
(74) *Attorney, Agent, or Firm*—Sherr & Vaughn, PLLC

(57) ABSTRACT

Embodiments relate to a method of manufacturing a semiconductor device, wherein voids on a copper seed layer may be removed. According to embodiments, a method of manufacturing a semiconductor device may include forming at least one type of an insulating layer on the entire surface of a semiconductor substrate, forming a contact hole and a trench, through which a portion of the semiconductor substrate is exposed, forming an anti-diffusion layer on inner walls of the contact hole and the trench, forming a copper seed layer on the anti-diffusion layer, removing a copper oxide layer exposed on a surface of the copper seed layer through a wet etching process, and forming a copper metal layer in the contact hole and the trench.

16 Claims, 4 Drawing Sheets

METHOD FOR FABRICATING SEMICONDUCTOR DEVICE

The present application claims priority under 35 U.S.C. 119 and 35 U.S.C. 365 to Korean Patent Application No. 10-2005-0134448 (filed on Dec. 29, 2005), which is hereby incorporated by reference in its entirety.

BACKGROUND

In the field of highly integrated semiconductor devices, studies and research are being actively pursued in relation to manufacturing semiconductor devices with copper interconnections. As for the copper interconnection, a damascene process may be used in which copper seeds are deposited, for example by using Ta and TaN as an anti-diffusion layer, and a copper interconnection is formed through an ECP (Electrochemical Chemical Plate) process.

In various situations, there may be errors with the damascene process that prevent the ECP from being properly completed. Accordingly, a copper oxide layer may be produced on a copper seed layer.

When a copper oxide layer is formed in such a manner during production of a semiconductor, voids may be produced on the copper seed layer.

SUMMARY

Embodiments relate to a method of manufacturing a semiconductor device. Embodiments relate to a method of manufacturing a semiconductor device, wherein voids on a copper seed layer may be removed.

In embodiments, a method of manufacturing a semiconductor device may include forming at least one type of an insulating layer on the entire surface of a semiconductor substrate, forming a contact hole and a trench, through which a portion of the semiconductor substrate is exposed, forming an anti-diffusion layer on inner walls of the contact hole and the trench, forming a copper seed layer on the anti-diffusion layer, removing a copper oxide layer exposed on a surface of the copper seed layer through a wet etching process, and forming a copper metal layer in the contact hole and the trench.

In embodiments, the copper oxide layer may be removed through a plasma dry etching method when removing the copper oxide layer.

In embodiments, a material used in the plasma dry etching method may include any one of He and Ar gases containing $H_2$.

In embodiments, removing the copper oxide layer may include loading a semiconductor substrate formed with the copper oxide layer into the interior of a sputter etch equipment, inserting any one of He and Ar gases containing H2 into the interior of the sputter etch equipment, and supplying a voltage to the interior of the sputter etch equipment such that any one of the He and Ar gases is reacted with the copper oxide layer In embodiments, the voltage supplied to the interior of the sputter etch equipment may be approximately −500 to −50V, and a temperature of an interior of the sputter etching equipment may be approximately 15 to 400° C.

In embodiments, removing the copper oxide layer may include loading a semiconductor substrate formed with the copper oxide layer into the interior of a CVD (Chemical Vapor Deposition) equipment, inserting any one of He and Ar gases containing NH3 and H2 into the interior of the CVD equipment, and supplying a voltage to the interior of the CVD equipment such that any one of the He and Ar gases is reacted with the copper oxide layer.

In embodiments, the voltage supplied to an interior of the CVD equipment may be approximately −500 to −50V, and a temperature of an interior of the CVD equipment may be approximately 15 to 400° C.

In embodiments, each insulating layer may include a first etch stop layer formed on an entire surface of the semiconductor substrate, an interlayer dielectric layer formed on the first etch stop layer, a second etch stop layer formed on the interlayer dielectric layer, and an interconnection insulating layer formed on the second etch stop layer.

In embodiments, forming the contact hole may include forming a first photoresist having a contact hole pattern on the interconnection insulating layer, sequentially removing the interconnection insulating layer, the second etching stop layer and the interlayer dielectric layer, which are exposed by using the first photoresist as a mask, thereby forming a contact hole, removing the first photoresist, forming a second photoresist having a trench pattern on the interconnection insulating layer; etching the interconnection insulating layer exposed by using the second photoresist as a mask, thereby forming a trench communicated with the contact hole, removing the second photoresist; and removing portions of the first and second etching stop layers exposed through the contact hole and the trench such that a portion of the semiconductor substrate is exposed.

In embodiments, forming the contact hole may further include forming a capping layer on the entire surface of the semiconductor substrate having the copper metal layer.

DETAILED DESCRIPTION OF EMBODIMENTS

Figure 1A:
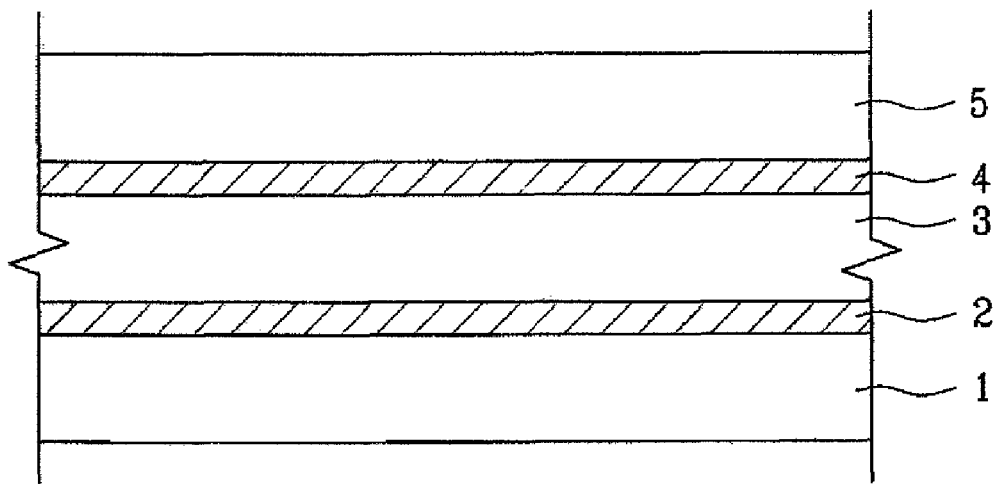
FIGS. 1a to 1g are example sectional diagrams illustrating a semiconductor and a method of manufacturing a semiconductor device according to embodiments.

Referring to FIG. 1a, first etch stop layer 2 may be formed on semiconductor substrate 1. Semiconductor substrate 1 may have a layer formed with a device electrode or conductive layer. First etch stop layer 2 may prevent a conductive layer from reacting with a metal interconnection that may be formed through a following process. First etch stop layer 2 may be used as an stop point for etching if an interlayer dielectric layer is etched in a following process.

Interlayer dielectric layer 3 may be deposited on a top surface of first etch stop layer 2. If interconnection insulating layer is etched on a top surface of interlayer dielectric layer 3, for example according to a following process, second etch stop layer 4 may be formed, and may be used as an etch stop point. Interconnection insulating layer 5, that may be used to form a metal interconnection layer, may be deposited on a top surface of second etch stop layer 4.

Each of first and second etch stop layers 2 and 4 may be formed as a nitride layer (SiN), for example by using an PECVD (Plasma Enhanced CVD).

Figure 1B:
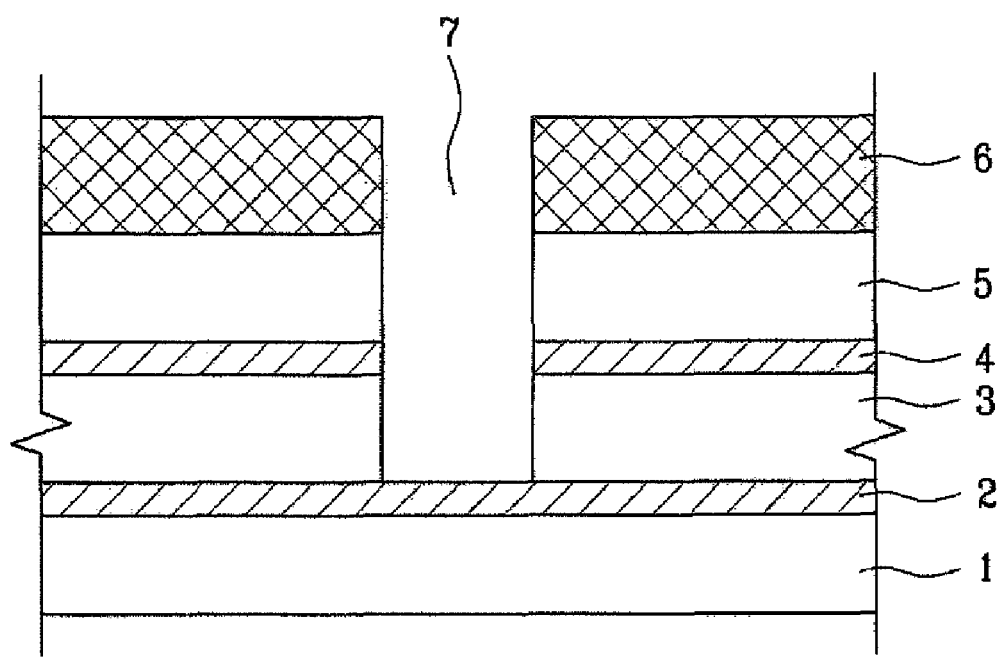

Referring to FIG. 1b, contact hole pattern 6 that may be used to form a contact hole, may be formed on a top surface of interconnection insulating layer 5 interconnection insulating layer 5 may be etched and removed, for example through a dry etching process using plasma, and contact hole pattern 6 may be used as a mask. The exposed second etch stop layer 4 may be etched and removed. The exposed interlayer dielectric layer 3 may be then etched and removed, thereby forming a contact hole in interlayer dielectric layer 3.

Figure 1C:
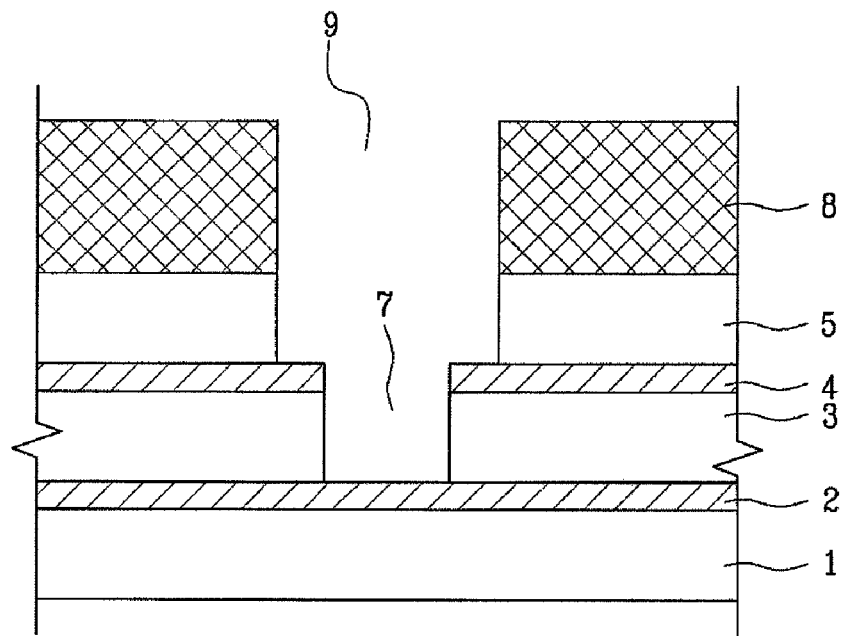

Referring to FIG. 1c, the contact hole pattern 6 may be removed. Trench pattern 8 may be formed on a top surface of interconnection insulating layer 5. Trench pattern 8 may be used to form a trench with a metal interconnection.

Further, the exposed interconnection insulating layer 5 may be etched and removed through a dry etching process, for example using plasma and using trench pattern 8 as a mask, thereby forming a trench 9 in interconnection insulating layer 5. Trench 9 may have a metal interconnection formed therein. In embodiments, second etch stop layer 4 may allow an etching process to be precisely finished at a top surface of interlayer dielectric layer 3 and may prevent a portion of a top surface of interlayer dielectric layer 3 from being etched. According to embodiments, second etch stop layer 4 may be deposited on a top surface of interlayer dielectric layer 3. Interlayer dielectric layer 3 may thereby be prevented from being additionally etched from a top surface thereof when etching interconnection insulating layer 5.

Figure 1D:
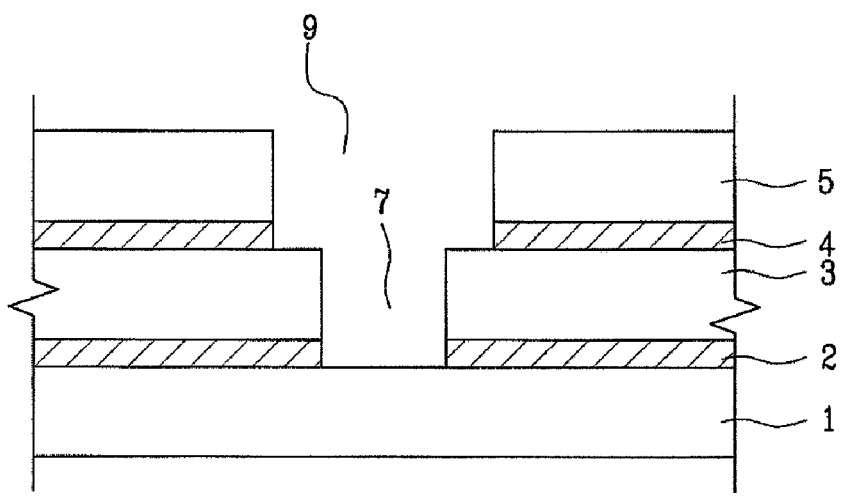

Referring to FIG. 1d, a surface of second etch stop layer 4 may be exposed and etching interconnection insulating layer 5 may be finished. Trench pattern 8 on the top surface of interconnection insulating layer 5 may then be removed. Further, first and second etching stop layers 2 and 4 respectively exposed in the contact hole 7 of interlayer dielectric layer 3 and in the lower trench of interconnection insulating layer 5 may be simultaneously etched and removed. In embodiments, the first and second etch stop layers 2 and 4 may be insulating layers. First and second etch stop layers 2 and 4 may therefore be removed to conduct a current from a metal interconnection to a conductive layer of a lower layer and to obtain desired dielectric capacitance.

Figure 1E:
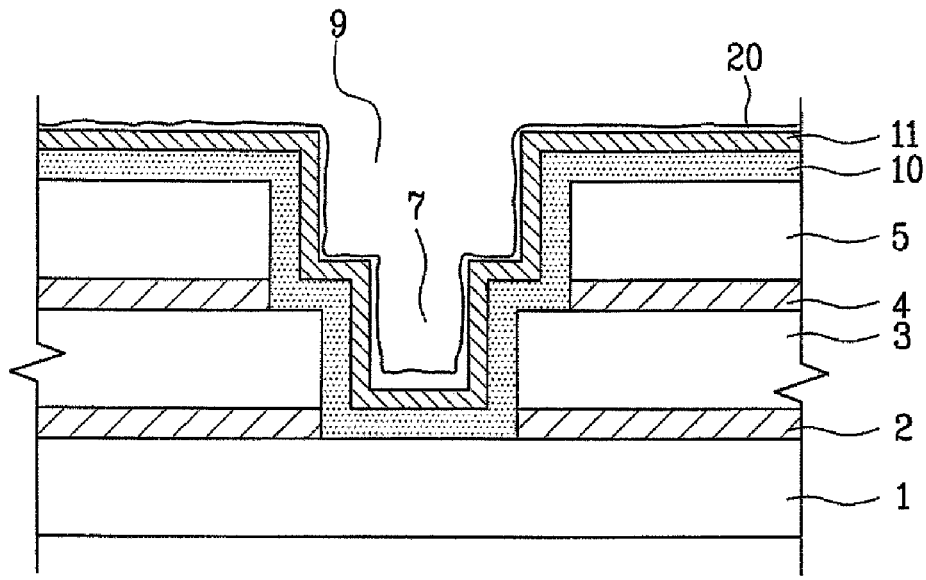
Figure 1F:
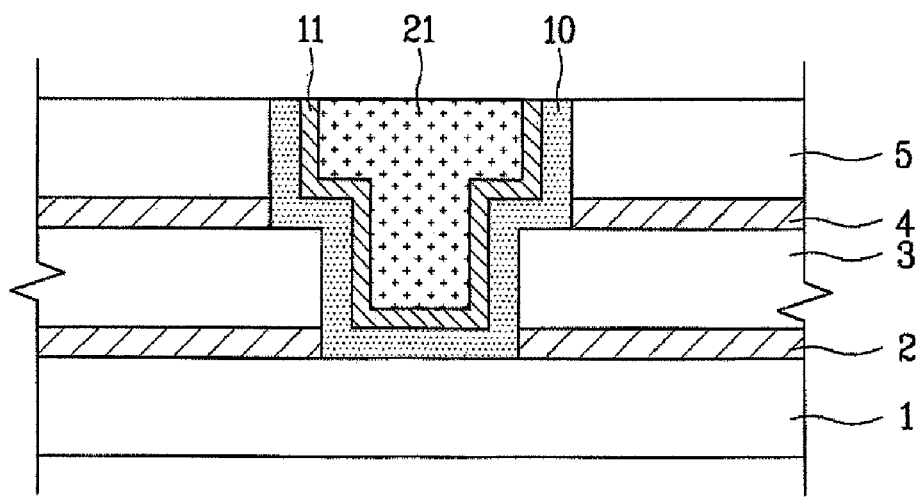

Referring to FIG. 1e, anti-diffusion layer 10 may be deposited on a surface, for example the entire top surface, of a lower layer of semiconductor substrate 1 before depositing the metal interconnection layer 21 (FIG. 1f). This may prevent a reaction between metal interconnection layer 21 and a conductive layer of the lower layer of the semiconductor substrate 1. In embodiments, anti-diffusion layer 10 may include any one of Ta, TaN, Ti, TiN and WN.

Copper seed layer 11 may be formed on a top surface of anti-diffusion layer 10. According to embodiments, copper oxide layer 20 may be formed on copper seed layer 11.

Copper oxide layer 20 may be removed through a plasma dry etch method.

That is, a semiconductor substrate that may be formed with the copper oxide layer 20 may be loaded into the interior of a sputter etch equipment.

He or Ar gas that may contain $H_2$ may be injected into an interior of the sputter etch equipment. Further, a voltage may be supplied to an interior of the sputter etching equipment such that the He gas containing $H_2$ (or Ar gas containing $H_2$) may react with copper oxide layer 20. Copper oxide layer 20 may be removed through the reaction.

A voltage supplied to the interior of the sputter etch equipment may be approximately −500 to −50V, and a temperature of the interior of the sputter etch equipment may be approximately 15 to 400° C.

According to embodiments, copper oxide layer 20 may be removed in other manners, as well.

For example, semiconductor substrate 1 that be formed with copper oxide layer 20 may be loaded into an interior of a CVD (Chemical Vapor Deposition) equipment.

He or Ar gas that may contain $NH_3$ and $H_2$ may be injected into an interior of the CVD equipment. A voltage may be supplied to the interior of the CVD equipment such that the He gas containing $NH_3$ and $H_2$ (or the Ar gas containing $NH_3$ and $H_2$) may react with the copper oxide layer 20. The copper oxide film may be removed through the reaction.

The voltage supplied to the interior of the CVD equipment may be approximately −500 to −50V, and the temperature of the interior of the CVD equipment may be approximately 15 to 400° C.

Referring to FIG. 1f, metal interconnection layer 21 may be filled into contact hole 7 of interlayer dielectric layer 3 and the trench 9 of interconnection insulating layer 5.

In embodiments, metal interconnection layer 21 may be formed by depositing copper using a method such as electroless plating, electrolytic plating, sputtering, CVD, ECP (Electro Chemical Plating), or the like.

In embodiments, metal interconnection layer 21 and copper seed layer 11 and the anti-diffusion layer 10 on a top surface of interconnection insulating layer 5 may be polished and removed through a CMP (chemical mechanical polishing) process. A metal interconnection of a semiconductor device may thereby be completed.

Figure 1G:
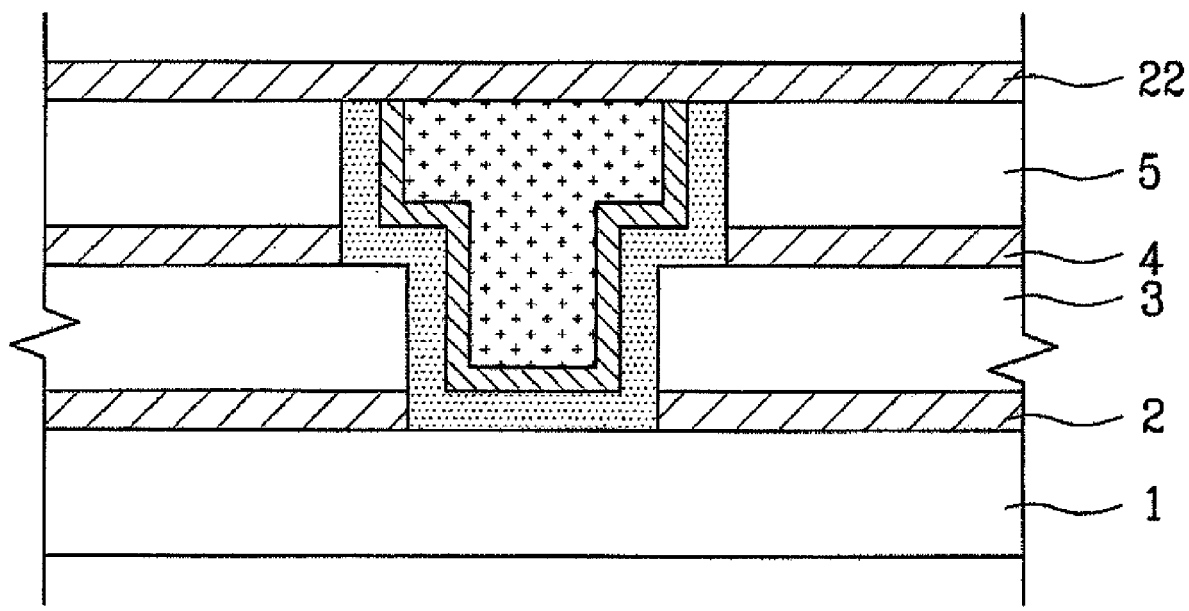

Referring to FIG. 1g, capping layer 22 may be formed on interconnection insulating layer 5, and may cover copper seed layer 11.

According to embodiments, after removing a copper oxide film formed with a copper seed layer, a copper interconnection may be formed. Voids may thereby be prevented from being produced on the copper seed layer.

It will be apparent to those skilled in the art that various modifications and variations can be made to embodiments. Thus, it is intended that embodiments cover modifications and variations thereof within the scope of the appended claims. It is also understood that when a layer is referred to as being "on" or "over" another layer or substrate, it can be directly on the other layer or substrate, or intervening layers may also be present.

What is claimed is:

1. A method comprising:
   forming an anti-diffusion layer on inner walls of a contact hole and a trench;
   forming a copper seed layer on the anti-diffusion layer;
   removing a copper oxide layer formed on a surface of the copper seed layer through a dry etching process; and
   forming a copper metal layer in the contact hole and the trench,
   wherein the copper oxide layer is removed through a plasma dry etching method and at least one of He and Ar gases containing $H_2$ is used in the plasma dry etching.

2. The method of claim 1, wherein the copper metal layer is formed over the copper seed layer.

3. The method of claim 1, wherein removing the copper oxide layer comprises:
   loading a semiconductor substrate formed with the copper oxide layer into an interior of a sputter etch equipment;
   inserting at least one of He and Ar gases containing $H_2$ into the interior of the sputter etch equipment; and
   supplying a voltage to the interior of the sputter etch equipment such that the at least one of He and Ar gases reacts with the copper oxide layer.

4. The method of claim 3, wherein the voltage is in a range of −500V to −50V.

5. The method of claim 3, wherein a temperature of the interior of the sputter etch equipment is in a range of 15°C. to 400°C.

6. The method of claim 1, wherein removing the copper oxide layer comprises:

loading a semiconductor substrate formed with the copper oxide layer into an interior of a CVD (Chemical Vapor Deposition) equipment;

inserting at least one of He and Ar gases containing $NH_3$ and $H_2$ into the interior of the CVD equipment; and supplying a voltage to the interior of the CVD equipment such that the at least one of He and Ar gases reacts with the copper oxide layer.

7. The method of claim 6, wherein the voltage is in a range of −500V to −50V.

8. The method of claim 6, wherein a temperature of the interior of the CVD equipment is in a range of 15°C. to 400°C.

9. The method of claim 1, further comprising:

forming at least one type of insulating layer on a surface of a semiconductor substrate; and forming the contact hole and the trench, through which a portion of the semiconductor substrate is exposed.

10. The method of claim 9, wherein the at least one type of insulating layer comprises:

a first etch stop layer formed over a surface of the semiconductor substrate;

an interlayer dielectric layer formed over the first etch stop layer;

a second etch stop layer formed over the interlayer dielectric layer; and an interconnection insulating layer formed over the second etch stop layer.

11. The method of claim 10, wherein forming the contact hole comprises:

forming a first photoresist having a contact hole pattern over the interconnection insulating layer;

sequentially removing the interconnection insulating layer, the second etch stop layer and the interlayer dielectric layer, which are exposed by using the first photoresist as a mask, thereby forming a contact hole;

removing the first photoresist;

forming a second photoresist having a trench pattern over the interconnection insulating layer;

etching the interconnection insulating layer using the second photoresist as a mask, thereby forming a trench over the contact hole;

removing the second photoresist; and removing portions of the first and second etch stop layers exposed through the contact hole and the trench such that a portion of the semiconductor substrate is exposed.

12. The method of claim 11, further comprising forming a capping layer on surfaces of the semiconductor substrate and the copper metal layer.

13. A device, comprising:

a semiconductor substrate having a plurality of layers;

a contact hole and a trench formed within the semiconductor substrate an anti-diffusion layer formed on inner walls of the contact hole and the trench;

a copper seed layer formed over the anti-diffusion layer; and a copper metal layer formed in the contact hole and the trench, wherein the copper metal layer is formed after a copper oxide layer is removed from the copper seed layer by dry etching, wherein the copper oxide layer is removed through a plasma dry etching method and at least one of He and Ar gases containing $H_2$ is used in the plasma dry etching.

14. The device of claim 13, further comprising a capping layer formed over a top surface of the semiconductor substrate, the anti-diffusion layer, the copper seed layer, and the copper metal layer.

15. The device of claim 13, wherein the plurality of layers comprises at least one insulating layer and at least one etch stop layer.

16. The device of claim 13, wherein the plurality of layers comprises:

a first etch stop layer formed over a surface of the semiconductor substrate;

an interlayer dielectric layer formed over the first etch stop layer;

a second etch stop layer formed over the interlayer dielectric layer; and an interconnection insulating layer formed over the second etch stop layer.

\* \* \* \* \*